United States Patent [19]
Inoue et al.

[11] Patent Number: 6,048,659
[45] Date of Patent: Apr. 11, 2000

[54] RADIATION-SENSITIVE RESIN COMPOSITION

[75] Inventors: Masaaki Inoue, Suzuka; Katsumi Inomata, Tsuchiura; Hiromichi Hara; Yoshiji Yumoto, both of Yokkaichi, all of Japan

[73] Assignee: JSR Corporation, Tokyo, Japan

[21] Appl. No.: 09/165,096

[22] Filed: Oct. 2, 1998

[30] Foreign Application Priority Data

Oct. 3, 1997 [JP] Japan .................................. 9-287869

[51] Int. Cl.$^7$ ............................. G03F 7/023; G03F 7/30
[52] U.S. Cl. ..................... 430/191; 430/165; 430/192; 430/193; 430/326
[58] Field of Search .................... 430/191, 192, 430/193, 165, 326

[56] References Cited

U.S. PATENT DOCUMENTS

| | | | |
|---|---|---|---|
| 5,719,004 | 2/1998 | Lu et al. | 430/191 |
| 5,837,417 | 11/1998 | Rahman et al. | 430/169 |
| 5,853,948 | 12/1998 | Sawano et al. | 430/166 |
| 5,948,587 | 9/1999 | Kawabe et al. | 430/191 |

FOREIGN PATENT DOCUMENTS

| | | |
|---|---|---|
| WO 96/12988 | 5/1996 | WIPO . |
| WO 96/21175 | 7/1996 | WIPO . |

OTHER PUBLICATIONS

Derwent Abstracts, AN 97–376739, JP 09 160231, Jun. 20, 1997.

Derwent Abstracts, AN 97–376736, JP 09 160228, Jun. 20, 1997.

*Primary Examiner*—John S. Chu
*Attorney, Agent, or Firm*—Oblon, Spivak, McClelland, Maier & Neustadt, P.C.

[57] ABSTRACT

A radiation-sensitive resin composition including (1) an alkali-soluble resin, (2) a quinonediazide compound and (3) a mixed solvent including a monoketone having 7 to 14 carbon atoms and an alkoxypropionic acid alkyl ester is provided. The composition can be coated in a uniform thickness in a small coating weight. The composition has a high sensitivity and a high resolution, and also enables formation of resist patterns having a superior pattern shape with less pattern defects. Thus, it is suitable as a positive resist.

20 Claims, 1 Drawing Sheet

RADIATION-SENSITIVE RESIN COMPOSITION

BACKGROUND OF THE INVENTION

1. Field of the Invention

This invention relates to a radiation-sensitive resin composition, and more particularly to a radiation-sensitive resin composition especially suitable as a positive resist used for fabricating integrated circuits, that is sensitive to a variety of radiations including ultraviolet radiations, far-ultraviolet radiations, X-radiations and electron radiations.

2. Description of the Prior Art

Positive resists are widely used in the fabrication of integrated circuits. In recent years, as integrated circuits have become more highly integrated, it is sought to provide positive resists that enables highly sensitive formation of high-resolution resist patterns.

With such higher integration, it is also important to coat the resist in a uniform thickness in order to form fine resist patterns in a good dimensional accuracy. Meanwhile, substrates (silicone wafers) show a tendency to increase in diameter from 4 inches to 6 inches and to 8 inches as area per sheet. With an increase in area of the substrate, it commonly becomes difficult to coat the resist in a uniform thickness. Moreover, for economical reasons, it is sought to provide a resist that can be coated not only in a uniform thickness but also in a small coating weight in order to improve efficiency when integrated circuits are fabricated.

In more recent years, pattern defects after development which are a cause of low yield of integrated circuit have come into a great question, which is sought to be solved.

However, any resists that can meet all of these demands are not known in the art. For example, Japanese Pre-examination Patent Publication (kokai) No. 9-160231 discloses a proposal of a resist composition containing a mixed solvent of (a) from 40 to 80% by weight of 3-methoxybutyl acetate and (b) from 60 to 20% by weight of 2-heptanone. Japanese Pre-examination Patent Publication (kokai) No. 9-160228 discloses a proposal of a resist composition containing methyl n-amyl ketone (2-heptanone) in an amount of 70% by weight or more based on the total weight of solvents. The resist compositions in these proposals can be effective for improving coating properties on substrates, but can not be said to have satisfactory performances in respect of sensitivity, resolution and pattern shape.

SUMMARY OF THE INVENTION

An object of the present invention is to provide a radiation-sensitive resin composition suitable as positive resists, that can be coated in a uniform thickness in a small coating weight and yet may hardly cause pattern defects, and also enables highly sensitive formation of high-resolution resist patterns having a superior pattern shape.

According to the present invention, the above object can be achieved by a radiation-sensitive resin composition comprising (1) an alkali-soluble resin, (2) a quinonediazide compound and (3) a mixed solvent comprising a monoketone having 7 to 14 carbon atoms (hereinafter "solvent A") and an alkoxypropionic acid alkyl ester (hereinafter "solvent B").

The radiation-sensitive resin composition of the present invention can be coated in a uniform thickness in a small coating weight as a positive resist and yet may hardly cause pattern defects, and also enables highly sensitive formation of high-resolution resist patterns having a superior pattern shape.

BRIEF DESCRIPTION OF THE DRAWINGS

Figure of the accompanying drawing schematically illustrates three types of sectional profiles of resist patterns obtained in Examples and Comparative examples described below. The shape of (A) is indicated as "Rectangular", that of (B) as "Trapezoidal", and that of (C) as "Scooped at bottom".

DESCRIPTION OF THE PREFERRED EMBODIMENTS

Figure 1C:
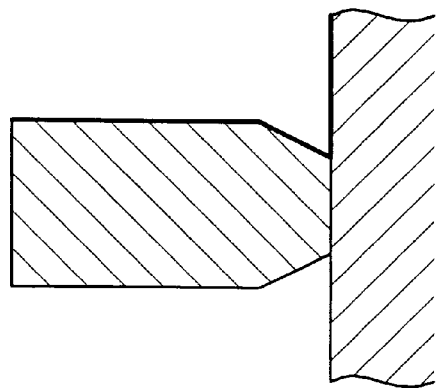
Figure 1B:
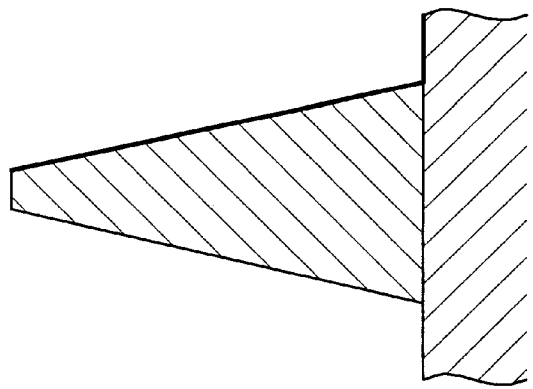
Figure 1A:
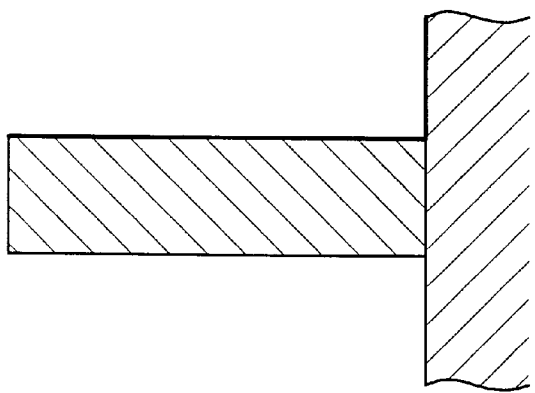

The present invention will be described below in detail.

(1) Alkali-soluble resin

The alkali-soluble resin (hereinafter, referred to as "resin (A)") used in the present invention may include, e.g., novolak resin, polyhydroxystyrene or derivatives thereof, a styrene-hydroxystyrene copolymer or derivatives thereof, and a styrene-maleic anhydride copolymer. Of these, novolak resin is preferred.

The novolak resin is obtained by subjecting a phenol and an aldehyde to polycondensation in the presence of an acid catalyst. The phenol used here may include, e.g., phenol, o-cresol, m-cresol, p-cresol, 2,3-xylenol, 2,4-xylenol, 2,5-xylenol, 3,4-xylenol, 3,5-xylenol, 2,3,5-trimethylphenol, 3,4,5-trimethylphenol, hydroquinone, catechol, resorcinol, 2-methylresorcinol, pyrogallol, a-naphthol and β-naphthol. Of these phenols, phenol, o-cresol, m-cresol, p-cresol, 2,3-xylenol, 2,4-xylenol, 2,5-xylenol, 3,4-xylenol, 3,5-xylenol and 2,3,5-trimethylphenol are preferred. Any of these phenols may be used alone or in combination of two or more. In particular, a preferred combination may include m-cresol/p-cresol, m-cresol/2,3-xylenol, m-cresol/2,4-xylenol, m-cresol/ 2,3,5-trimethylphenol, phenol/2,3-xylenol/3,4-xylenol, m-cresol/2,3-xylenol/3,4-xylenol and m-cresol/2,3-xylenol/2,3,5-trimethylphenol. The m-cresol used in these preferred combinations may usually be in an amount of from 30% by weight or more, and preferably 50% by weight or more, based on the total weight of the phenols.

The aldehyde with which the above phenol is subjected to polycondensation may include, e.g., formaldehyde, trioxane, paraformaldehyde, acetaldehyde, propylaldehyde, phenylacetaldehyde, benzaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, furfural, 1-napthaldehyde, 2-napthaldehyde and 2-hydroxy-1-napthaldehyde. In particular, formaldehyde and o-hydroxybenzaldehyde may preferably be used. An of these aldehydes may be used alone or in combination of two or more.

The aldehyde may usually be used in an amount of from 0.5 to 3 mols, and preferably form 0.6 to 1.5 mols, per mol of the phenol.

In the polycondensation reaction of the phenol with the aldehyde, an acid catalyst is used. This acid catalyst may include, e.g., hydrochloric acid, nitric acid, sulfuric acid, acetic acid, oxalic acid and p-toluenesulfonic acid. It may be used in an amount of from $1 \times 10^{-4}$ to $5 \times 10^{-1}$ mol per mol of the phenol.

In the polycondensation reaction, water is usually used as a reaction medium. If the phenol used in the reaction does not dissolve in the aqueous solution of the aldehyde to make the reaction mixture non-uniform from the beginning of the reaction, a solvent such as an alcohol, an ether or a ketone may be used as the reaction medium. Here, as the alcohol, it may include, e.g., methanol, ethanol, butanol and propylene glycol monomethyl ether; as the ether, tetrahydrofuran and dioxane; and as the ketone, methyl ethyl ketone, methyl isobutyl ketone and 2-heptanone. Such a reaction medium may usually be used in an amount of from 20 to 500 parts by weight based on 100 parts by weight of the reactants.

The condensation reaction may be carried out usually at a temperature of from 10 to 200° C., which may appropriately be adjusted in accordance with the reactivity of reactants. The reaction may be carried out by appropriately employing a method in which the phenol, the aldehyde, the catalyst and the solvent are charged together, or a method in which the phenol and the aldehyde are added with progress of the reaction.

After the reaction is completed, in order to remove the unreacted materials, acid catalyst and reaction medium and also recover the novolak resin, commonly the reaction temperature of the system is raised to 130 to 230° C. and volatile components are removed under reduced pressure. Another method is also available in which the novolak resin thus obtained is, e.g., dissolved in a good solvent such as ethyl acetate, methanol or methyl isobutyl ketone, thereafter a bad solvent such as water, n-hexane or n-heptane is added and the resin solution layer thereby settled is separated to obtain a resin with a relatively high molecular weight.

The novolak resin may preferably have a weight-average molecular weight in terms of polystyrene (hereinafter "Mw") of from 2,000 to 20,000, and more preferably from 3,000 to 15,000. If it has too a large Mw, it may be difficult to coat the composition on the wafer uniformly and may also result in low developability and sensitivity. If it has too a small Mw, the composition tends to have a low thermal resistance required as a resist.

(2) Quinonediazide compound

The quinonediazide compound used in the present invention may include, but not particularly limited to, 1,2-benzoquinonediazido-4-sulfonic acid esters, 1,2-naphthoquinonediazido-4-sulfonic acid esters, 1,2-naphthoquinonediazido-5-sulfonic acid esters or 1,2-naphthoquinonediazido-6-sulfonic acid esters of polyhydroxyl compounds. In particular, 1,2-naphthoquinonediazido-4 -sulfonic acid esters and 1,2-naphthoquinonediazido-5-sulfonic acid esters are preferred.

The quinonediazide compound can be obtained by, e.g., allowing a polyhydroxyl compound to react with quinonediazidosulfonyl chloride in the presence of a basic catalyst. Usually, the proportion of the quinonediazidosulfonic acid ester to the total hydroxyl groups of the polyhydroxyl compound (average esterification percentage) is from 20% to 100%, and preferably from 40% to 95%. If the average esterification percentage is too low, the pattern may be formed with difficulty, and if it is too high, there is a possibility of causing a poor developability and a low sensitivity.

There are no particular limitations on the polyhydroxyl compound used here. As examples thereof, it may include the following compounds.

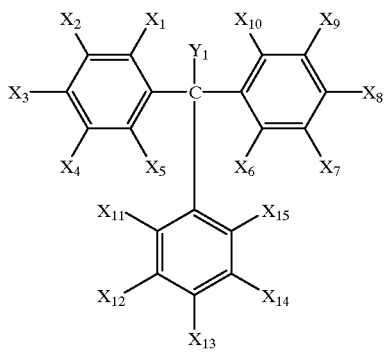

wherein $X_1$ to $X_{15}$ are the same or different and each represent a hydrogen atom, an alkyl group having 1 to 4 carbon atoms, an alkoxyl group having 1 to 4 carbon atoms, an aryl group having 6 to 10 carbon atoms or a hydroxyl group, provided that at least one member in each of the groups $X_1$ to $X_5$ and $X_6$ to $X_{10}$ is a hydroxyl group; and $Y_1$ represents a hydrogen atom or an alkyl group having 1 to 4 carbon atoms.

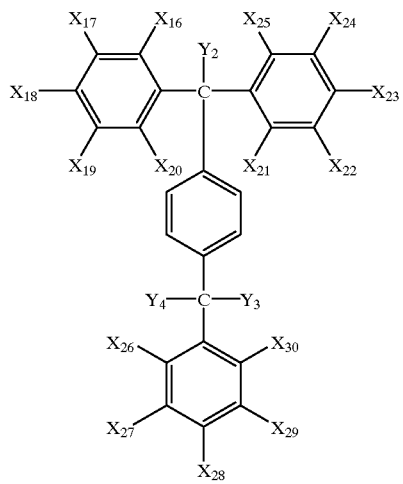

wherein $X_{16}$ to $X_{30}$ are as defined for the above $X_1$ to $X_{15}$, provided that at least one member in each of the groups $X_{16}$ to $X_{20}$, $X_{21}$ to $X_{25}$ and $X_{26}$ to $X_{30}$ is a hydroxyl group; and $Y_2$ to $Y_4$ are the same or different and each represent a hydrogen atom or an alkyl group having 1 to 4 carbon atoms.

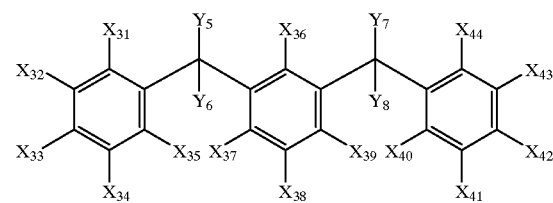

wherein $X_{31}$ to $X_{44}$ are as defined for the above $X_1$ to $X_{15}$, provided that at least one member in the group $X_{31}$ to $X_{35}$ is a hydroxyl group; and $Y_5$ to $Y_6$ are the same or different and each represent a hydrogen atom or an alkyl group having 1 to 4 carbon atoms.

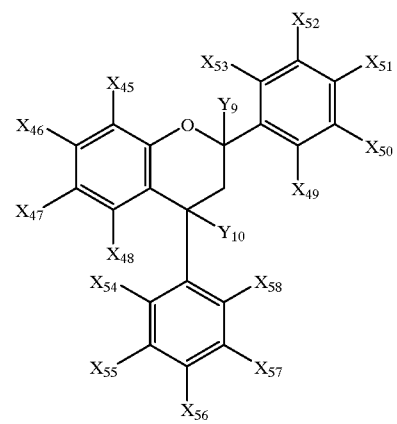

wherein $X_{45}$ to $X_{58}$ may be the same or different and each represent a hydrogen atom, a halogen atom, an alkyl group having 1 to 4 carbon atoms, an alkoxyl group having 1 to 4 carbon atoms, a cycloalkyl group having 5 to 7 carbon atoms or a hydroxyl group, provided that at least one member in each of the groups $X_{45}$ to $X_{48}$ and $X_{49}$ to $X_{53}$ is a hydroxyl group; and $Y_9$ and $Y_{10}$ are the same or different and each represent a hydrogen atom, an alkyl group having 1 to 4 carbon atoms or a cycloalkyl group having 5 to 7 carbon atoms.

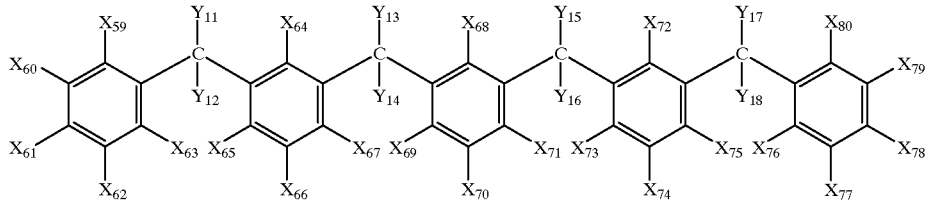

wherein $X_{59}$ to $X_{80}$ are as defined for the above $X_{45}$ to $X_{58}$, provided that at least one member in each of the groups $X_{59}$ to $X_{63}$, $X_{64}$ to $X_{67}$, $X_{72}$ to $X_{75}$ and $X_{76}$ to $X_{80}$ is a hydroxyl group; and $Y_{11}$ to $Y_{18}$ are the same or different and each represent a hydrogen atom or an alkyl group having 1 to 4 carbon atoms.

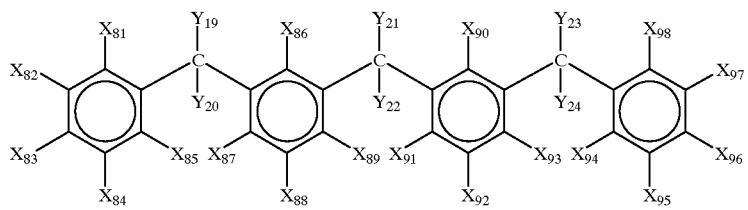

wherein $X_{81}$ to $X_{98}$ are as defined for the above $X_{45}$ to $X_{58}$, provided that at least one member in each of the groups $X_{81}$ to $X_{85}$, $X_{86}$ to $X_{89}$, $X_{90}$ to $X_{93}$ and $X_{94}$ to $X_{98}$ is a hydroxyl group; and $Y_{19}$ to $Y_{24}$ are the same or different and each represent a hydrogen atom or an alkyl group having 1 to 4 carbon atoms.

In the composition of the present invention, the quinonediazide compound of component (2) may preferably be used in an amount of from 5 to 60 parts by weight, and particularly from 10 to 50 parts by weight, based on 100 parts by weight of the resin (A) of component (1). The quinonediazide compound may be used alone or in combination of two or more.

The 1,2-quinonediazide sulfonyl residual group held in the composition of the present invention may preferably be so adjusted as to be in an amount of from 5 to 50% by weight, and more preferably from 10 to 30% by weight, based on the weight of the total solid content of the composition. If the quinonediazide compound is mixed in too a small amount, there can be almost no difference in solubility in a developing solution (aqueous alkaline solution) between radiation-exposed areas and radiation-unexposed areas when the composition is used as a resist, tending to make it difficult to form patterns. If on the other hand the quinonediazide compound is mixed in a too large amount, the quinonediazide compound mixed may dissolve with difficulty if exposed to radiations for a short time, making it difficult to carry out development with the developing solution.

The quinonediazide compound may be used alone or in combination of two or more.

For the purpose of improving the alkali-solubility of the resin (A), a low-molecular-weight phenol compound (hereinafter "dissolution accelerator") may be added to the composition of the present invention. This dissolution accelerator may preferably be a phenol compound having 2 to 5 benzene rings, which may include, e.g., compounds represented by the following formulas (1—1) to (1-9):

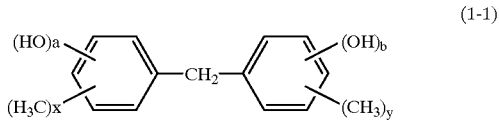
(1-1)

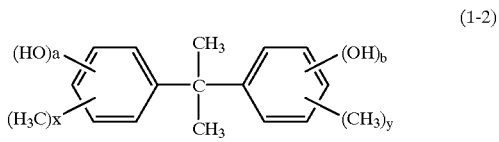
(1-2)

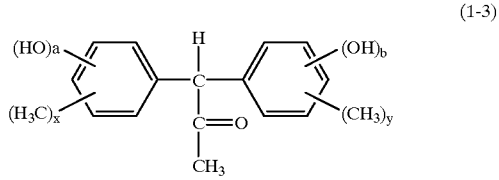
(1-3)

wherein in the formulas (1—1) to (1-3), a and b are each independently an integer of 0 to 3, provided that they are not 0 at the same time; x and y are each independently an integer of 0 to 3; and $a+x \leq 5$ and $b+y \leq 5$,

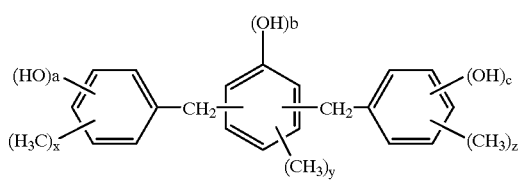
(1-4)

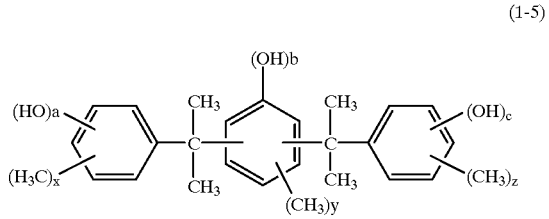
(1-5)

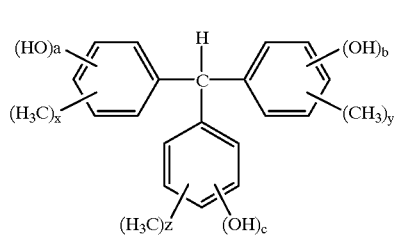
(1-6)

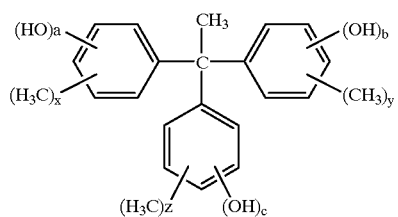
(1-7)

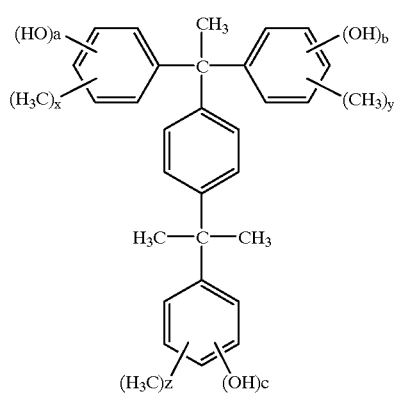
(1-8)

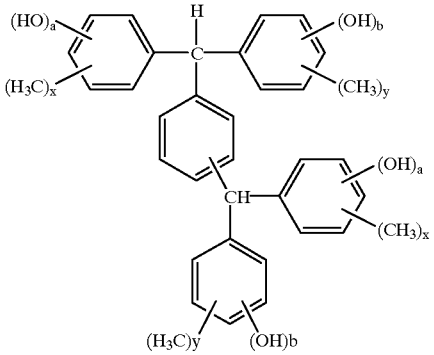
(1-9)

wherein in the formulas (1-4) to (1-9), a, b and c are each independently an integer of 0 to 3, provided that they are not 0 at the same time; x, y and z are each independently an integer of 0 to 3; in the formulas (1-4) and (1-5), $b+y \leq 4$; and in the formulas (1-6) to (1-9), $a+x \leq 5$, $b+y \leq 4$ and $c+z \leq 5$.

Such a dissolution accelerator may usually be mixed in an amount of not more than 50 parts by weight, and preferably from 5 to 30 parts by weight, based on 100 parts by weight of the component-(1) resin (A).

(3) Mixed solvent

Solvent A:

The monoketone having 7 to 14 carbon atoms (solvent A) used in the present invention may include, e.g., aliphatic monoketones such as 2-heptanone, 3-heptanone, 4-hepotanone, methyl-n-hexyl ketone, methyl-n-octyl ketone, methyl-n-dodecyl ketone, ethyl-n-pentyl ketone, di-n-propyl ketone, diisopropyl ketone, n-propyl isopropyl ketone, di-n-butyl ketone and di-n-pentyl ketone; and alicyclic monoketones such as 2-methylcyclohexanone, 3-methylcyclohexanone, 4-methylcyclohexanone, 2-ethylcyclohexanone, 4-ethylcyclohexanone, 2-t-butylcyclohexanone, cycloheptanone, cyclooctanone, cyclononanone and cycloundecanone. It may preferably include 2-heptanone, 3-heptanone, 4-heptanone and methyl-n-hexyl ketone. These solvents can be used singly or in combination of two or more.

Solvent B:

The alkoxypropionic acid alkyl ester (solvent B) used in the present invention may include, e.g., methyl 3-methoxypropionate, ethyl 3-methoxypropionate, methyl 3-ethoxypropionate, ethyl 3-ethoxypropionate, n-propyl 3-methoxypropionate and n-butyl 3-methoxypropionate. It may preferably include methyl 3-methoxypropionate and ethyl 3-ethoxypropionate. These solvents can be used singly or in combination of two or more.

These solvents A and B may be mixed in a weight ratio of A/B of normally 10/90 to 90/10, preferably 20/80 to 85/15, more preferably 30/70 to 80/20, still more preferably 50/50 to 80/20.

So long as the effect of the present invention is not damaged, the following solvent (hereinafter "solvent C")

may also be mixed, as exemplified by monoketone compounds having 3 to 6 carbon atoms (e.g., methyl ethyl ketone and methyl isobutyl ketone), methyl cellosolve acetate, ethyl cellosolve acetate, propylene glycol monomethyl ether, propylene glycol monoethyl ether, propylene glycol monomethyl ether acetate, propylene glycol monoethyl ether acetate, ethyl lactate and butyl lactate; which may be contained in an amount not more than 30 parts by weight based on 100 parts by weight of the mixed solvent.

The mixed solvent comprising these solvents A and B may be used in an amount appropriately determined in accordance with the thickness of the resist coating film to be formed, and commonly be determined within such a range that the entire solid content in the composition is from 10 to 50% by weight.

Other Compounding Agents

In the composition of the present invention, various compounding agents such as surface-active agents, colorants (dyes or pigments), adhesion auxiliaries, storage stabilizers and antifoamers may optionally be mixed.

Surface-active agents are mixed in order to improve coating properties and developability of the composition. Such surface active agents may include, e.g., polyoxyethylene lauryl ether, polyoxyethylene oleyl ether, polyoxyethylene octyl phenyl ether, polyoxyethylene nonyl phenyl ether, polyethylene glycol dilaurate, and polyethylene glycol distearate. Commercially available products of these may include MEGAFAX F171, F172, F173, F471, R-07, R-08 (tradenames; available from Dainippon Ink & Chemicals, Incorporated), FLORADO FC430, FC431 (trade names; available from Sumitomo 3M Limited), ASAHI GUARD AG710, SURFLON S-382, SC-101, SC-102, SC-103, SC-104, SC-105, SC-106 (trade names; available from Asahi Glass Co., Ltd.), KP341 (trade name; available from Shin-Etsu Chemical Co., Ltd.), POLYFLOW No. 75, No. 95 (trade names; available from Kyoeisha Chemical Co., Ltd.), and NBX-7, NBX-8, NBX-15 (trade names; available from NEOS Company Limited).

The surface active agent may usually be mixed in an amount not more than 2 parts by weight based on 100 parts by weight of the solid content of the composition.

Colorants such as dyes and pigments are mixed in order to make them less affected by halation at the time of exposure to radiations.

Preparation of Radiation-sensitive Resin Composition

The composition of the present invention is prepared by dissolving the component-(1) alkali-soluble resin, the component-(2) quinonediazide compound and optionally the above various compounding agents in the component-(3) mixed solvent comprising the monoketone having 7 to 14 carbon atoms (solvent A) and the alkoxypropionic acid alkyl ester (solvent B) to form a solution so as for the solid content to be in a concentration of, e.g., from 10 to 50% by weight in the resultant solution, and filtering this solution with a filter of about 0.2 μm in pore size.

How to Use Radiation-sensitive Resin Composition

The composition of the present invention thus obtained is used as a resist when, e.g., integrated circuits are fabricated. The composition is used to form a resist pattern on a substrate such as silicon wafer. Such a process of preparing a resist pattern comprises the steps of coating a composition according to the present invention on a substrate to form a coating film, drying the coating film to form a resist film, exposing the resist film selectively to a radiation, and developing the exposed resist film to form a resist pattern. More specifically, first the composition is coated by a method such as rotary coating (spin coating), cast coating or roll coating on, e.g., a silicon wafer or a silicon wafer coated with aluminum or silicon nitride to form a resist coating comprising the radiation-sensitive resin composition. This coating is exposed to radiations in a preset pattern, and subsequently the resultant layer is developed with a developing solution comprising an aqueous alkaline solution, to form a pattern. In this instance, in order to more improve the effect as a resist, the resist coating formed as described above may be exposed to radiations after it has been pre-baked at 70 to 140° C., and may further be post-exposure-baked at 70 to 140° C., followed by development.

In the case of the development using the developing solution comprising an aqueous alkaline solution, it is commonly followed by washing with water.

As the radiations used here, ultraviolet radiations such as g-rays and i-rays, far-ultraviolet radiations such as KrF excimer laser beams, X-radiations such as synchrotron rays and charged-particle radiations such as electron rays. In particular, ultraviolet radiations, far-ultraviolet radiations or electron rays are preferred.

As the developing solution, an aqueous alkaline solution may be used which is prepared by dissolving an alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-[5.4.0]-7-undecene or 1,5-diazabicyclo-[4.3.0]-5-nonane, in water in a concentration of, e.g., 0.1 to 10% by weight. To the developing solution, a water-soluble organic solvent, e.g., an alcohol such as methanol and ethanol and a surface-active agent may be added in appropriate quantities.

EXAMPLES

The present invention will be described below in greater detail by giving Examples. The present invention is by no means limited by these Examples.

Synthesis of Resin (A)

In the following Synthesis Examples, the weight-average molecular weight Mw (in terms of polystyrene) of the resins obtained was measured by gel permeation chromatography using GPC columns (G2000HXL: two columns; G3000HXL: one column; G4000HXL: one column), available from Toso Co., Ltd., under analysis conditions of a flow rate of 1.0 ml/minute, an elution solvent tetrahydrofuran and a column temperature of 40° C., and using monodisperse polystyrene as a standard.

Synthesis Example 1

Into an autoclave:

| Into an autoclave; | |
|---|---|
| m-cresol | 69.2 g (0.64 mol); |
| 2,3-xylenol | 9.8 g (0.08 mol); |
| 3,4-xylenol | 9.8 g (0.08 mol); |
| an aqueous 37% by weight formaldehyde solution | 55.1 g (0.68 mol as HCHO); |
| Oxalic acid dihydrate | 5.0 g (0.04 mol); |
| water | 52.6 g; and |
| dioxane | 182 g; | were charged. Then, the autoclave was immersed in an oil bath, the temperature of the reaction solution was kept at 130° C., and polycondensation was carried out for 8 hours with stirring. Next, the reaction solution was cooled to room temperature and the contents were taken out and put into a beaker. Of the two layers separated in the beaker, the lower layer (resin layer) was collected. Thereafter, the resin layer was concentrated, dehydrated and dried to obtain resin (A1) having an Mw of 8,600.

Synthesis Example 2

The procedure of Synthesis Example 1 was repeated except that;

| | |
|---|---|
| m-cresol | 64.8 g (0.6 mol); |
| 2,3-xylenol | 36.7 g (0.3 mol); |
| 2,3,5-trimethylphenol | 13.6 g (0.1 mol); |
| an aqueous 37% by weight formaldehyde solution | 64.9 g (0.8 mol as HCHO); |
| Oxalic acid dihydrate | 6.3 g (0.05 mol); |
| water | 79.4 g; and |
| dioxane | 384 g; | were charged. Thus, resins (A2) having an Mw of 8,300 was obtained.

Synthesis Example 3

Into a 2-litter separable flask provided with a condenser tube and a stirrer, 48.8 g (0.4 mol) of 2,4-dimethylphenol, 172.8 g (1.6 mols) of m-cresol, 129.8 g of an aqueous 37% by weight formaldehyde solution (formaldehyde: 1.6 mols), 12.6 g (0.1 mol) of oxalic acid dihydrate and 554 g of methyl isobutyl ketone were charged to carry out condensation for 8 hours with stirring while keeping the internal temperature at 90 to 100° C. The resin solution thus formed was washed twice with 500 g of ion-exchanged water. Thereafter, 600 g of n-hexane was added thereto, and the resultant mixture was stirred for 30 minutes and then allowed to stand for 1 hour. The supernatant on the resin layer having settled was removed by decantation. Thereafter, the resin layer was concentrated, dehydrated and dried to obtain resin (A3) having an Mw of 8,300.

Synthesis of quinonediazidosulfonic acid ester compound

Synthesis Example 4

In a light-screened environment, into an flask having a stirrer, a dropping funnel and a thermometer, 29.2 g (0.1 mol) of the compound represented by the following formula (2), 67.1 g (0.25 mol) of 1,2-naphthoquinonediazido-5-sulfonic acid chloride and 481 g of dioxane were charged, and were dissolved with stirring. Subsequently, this flask was immersed in a water bath controlled to 30° C. At the time the internal temperature became constant at 30° C., 28.3 g (0.28 mol) of triethylamine was added to this solution by the use of the dropping funnel while controlling the internal temperature not to become higher than 35° C., and the reaction was carried out for 2 hours at the same temperature. Thereafter, the triethylamine hydrochloride having precipitated was removed by filtration, and the filtrate was poured into a large quantity of an aqueous dilute hydrochloric acid solution to cause the reaction product to precipitate. Then, the precipitate formed was filtered and collected, followed by drying at 40° C. for 24 hours in a vacuum dryer to obtain a quinonediazide compound (b-1).

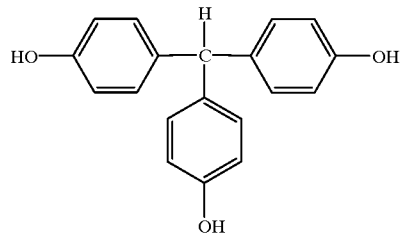

(2)

Synthesis Example 5

The procedure of Synthesis Example 4 was repeated except that 42.4 g (0.1 mol) of the compound represented by the following formula (3), 67.1 g (0.25 mol) of 1,2-naphthoquinonediazido-5-sulfonic acid chloride and 547 g of dioxane were charged. Thus, a quinonediazide compound (b-2) was obtained.

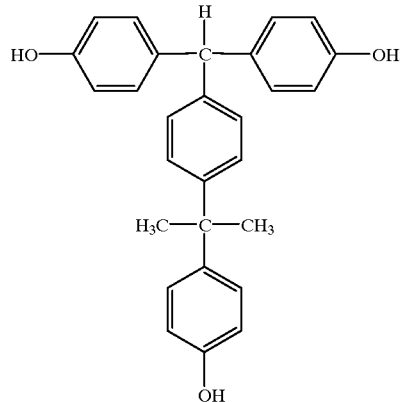

(3)

Synthesis Example 6

The procedure of Synthesis Example 4 was repeated except that 37.8 g (0.1 mol) of the compound represented by the following formula (4), 40.2 g (0.15 mol) of 1,2-naphthoquinonediazido-5-sulfonic acid chloride, 300 g of dioxane, 90 g of N,N-dimethylformamide and 16.7 g (0.17 mol) of triethylamine were used. Thus, a quinonediazide compound (b-3) was obtained.

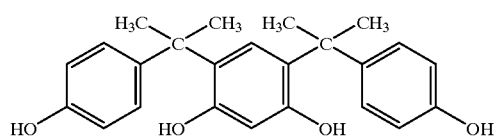

(4)

Synthesis Example 7

The procedure of Synthesis Example 4 was repeated except that 36.4 g (0.1 mol) of the compound represented by the following formula (5), 80.5 g (0.3 mol) of 1,2-naphthoquinonediazido-5-sulfonic acid chloride, 585 g of dioxane and 33.4 g (0.33 mol) of triethylamine were used. Thus, a quinonediazide compound (b-4) was obtained.

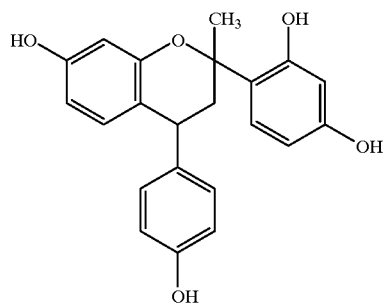

(5)

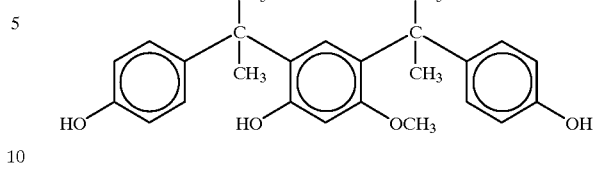

(7)

Synthesis Example 10

Synthesis Example 8

The procedure of Synthesis Example 4 was repeated except that 64.6 g (0.1 mol) of the compound represented by the following formula (6), 40.2 g (0.15 mol) of 1,2-naphthoquinonediazido-5-sulfonic acid chloride, 390 g of dioxane, 130 g of N,N-dimethylformamide and 167 g (0.17 mol) of triethylamine were used. Thus, a quinonediazide compound (b-5) was obtained.

The procedure of Synthesis Example 4 was repeated except that 24.8 g (0.05 mol) of the compound represented by the following formula (8), 33.5 g (0.125 mol) of 1,2-naphthoquinonediazido-5-sulfonic acid chloride, 350 g of dioxane and 14.1 g (0.14 mol) of triethylamine were used. Thus, a quinonediazide compound (b-7) was obtained.

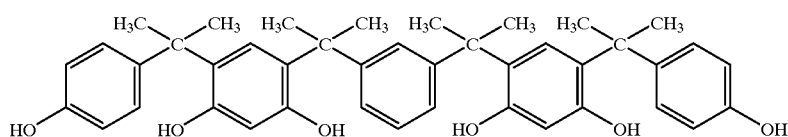

(6)

Synthesis Example 9

The procedure of Synthesis Example 4 was repeated except that 39.2 g (0.05 mol) of the compound represented by the following formula (7), 40.2 g (0.125 mol) of 1,2-naphthoquinonediazido-5-sulfonic acid chloride, 476 g of dioxane and 17.2 g (0.17 mol) of triethylamine were used. Thus, a quinonediazide compound (b-6) was obtained.

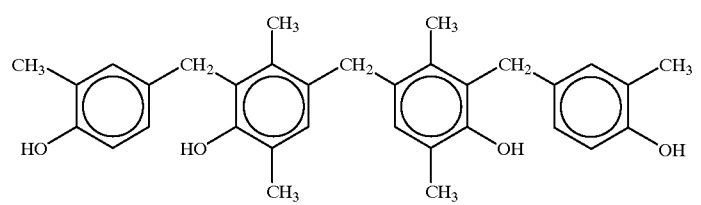

(8)

Examples 1 to 9

Under formulation as shown in Table 1 ("parts" is "parts by weight"), the resin (A), the dissolution accelerator, the guinonediazide compound and the solvents A and B were mixed to form uniform solutions, followed by filtration using a membrane filter of 0.2 μm in pore size to prepare solution type radiation-sensitive resin compositions.

The solutions thus obtained were each coated on a 6-inch silicon wafer having a silicon oxide film, by means of a spin coater, followed by prebaking on a hot plate at 90° C. for 90 seconds to form a resist film of 1.3 μm thick. Next, through a reticle, the resist film was exposed to ultraviolet rays of 365 nm in wavelength (i-rays) by means of a reduction projection aligner (numerical lens aperture: 0.50) NSR-2005i9C, manufactured by Nikon K. K., followed by postbaking on a hot plate at 110° C. for 60 seconds, and then developed using an aqueous 2.38% by weight tetramethylammonium hydroxide solution, followed by rinsing with ultra-pure water and then drying to form resist patterns.

Characteristics as those of the resist patterns thus obtained were evaluated by the methods described below.

Results obtained are shown in Table 2.

Sensitivity:

Amount of exposure required when line-and-space patterns of 0.6 μm were resolved in a ratio of 1:1 (amount of correct exposure) was regarded as indication of sensitivity.

Resolution:

The minimum size in which line-and-space patterns stood separate in a state free of pattern film loss when exposed in the amount of correct exposure was regarded as indication of resolution, which was measured with a scanning electron microscope.

Pattern shape:

Cross sections in depth of resist patterns of 0.6 μm were observed using a scanning electron microscope. Cross sections having rectangular shape are normal. The shapes of (A), (B) and (C) in Figure are indicated as Rectangular, Trapezoidal and Scooped at bottom.

Layer thickness uniformity:

Wafers having resist films formed by coating on 6-inch silicon wafer surfaces in a layer thickness of 1.3 μm were examined on their layer thickness measured at 39 points in the diameter direction, to determine differences between maximum layer thickness and minimum layer thickness in the plane.

Pattern defects:

Wafers coated and subjected to exposure and development as described above were examined on the number of defects of 0.2 μm or larger, using a wafer profile tester KLA-2112, manufactured by KLA Co.

Comparative Examples 1 to 3

Solution type compositions were prepared in the same manner as in Examples 1 to 9, except that the solvents were changed according to the compositional proportion as shown in Table 1. Resist patterns were formed on silicon wafers similarly, and the characteristics of the resist patterns formed were examined in the same manner as in Examples.

Results obtained are shown in Table 2.

TABLE 1

|  | Resin (A) (parts) | Dissolution accelerator (parts) | Quinonediazide compound (parts) | Solvents A/B/C (parts) |
|---|---|---|---|---|
| Example 1 | A1 (80) | α (20) | (b-1)/(b-3) (10/10) | A-1/B-1 (288/72) |
| Example 2 | A1 (80) | β (20) | (b-1)/(b-3) (10/10) | A-1/B-2 (288/72) |
| Example 3 | A2 (80) | α (20) | (b-2)/(b-3) (10/10) | A-1/B-2 (252/108) |
| Example 4 | A1 (80) | α (20) | (b-3)/(b-4) (8/15) | A-1/B-2 (295/74) |
| Example 5 | A2 (80) | γ (20) | (b-3)/(b-4) (8/15) | A-2/B-1 (185/185) |
| Example 6 | A1 (80) | β (20) | (b-4)/(b-5) (10/10) | A-1/B-3 (216/144) |
| Example 7 | A1 (80) | α (20) | (b-3)/(b-4) (8/15) | A-1/B-2/C-1 (258/74/37) |
| Example 8 | A3 (80) | γ (20) | (b-6)/(b-7) (15/8) | A-1/B-1 (180/180) |
| Example 9 | A3 (80) | β (20) | (b-4)/(b-7) (13/12) | A-1/B-1 (252/108) |
| Comparative Example 1 | A1 (80) | α (20) | (b-1)/(b-3) (10/10) | A-1 (360) |
| Comparative Example 2 | A1 (80) | β (20) | (b-1)/(b-3) (10/10) | B-1 (360) |
| Comparative Example 3 | A2 (80) | α (20) | (b-2)/(b-3) (10/10) | A-1/C-2 (288/72) |

In Table 1, the types of the dissolution accelerators and solvents are as follows:

Dissolution accelerator:

α: 1,1-bis(4-hydroxyphenyl)-1-[4-{1-(4-hydroxyphenyl)-1-methylethyl}phenyl]ethane β: 1,1-bis(4-hydroxyphenyl)-1-phenylethane γ: 1,1-bis(2,5-dimethyl-4-hydroxyphenyl)acetone Solvents:

Solvent A

A-1: 2-heptanone

A-2: 3-heptanone

Solvent B

B-1: methyl 3-methoxypropionate

B-2: ethyl 3-ethoxyproplonate

B-3: ethyl 3-methoxypropionate

Solvent C

C-1: ethyl lactate

C-2: γ-butyrolactone

TABLE 2

|  | Sensitivity (msec) | Resolution (μm) | Pattern shape | Layer thickness uniformity (Å) | Pattern defects (the number) |
|---|---|---|---|---|---|
| Example 1 | 180 | 0.48 | Rectangular | 9 | 8 |
| Example 2 | 200 | 0.48 | Rectangular | 8 | 12 |
| Example 3 | 310 | 0.44 | Rectangular | 7 | 13 |

TABLE 2-continued

| | Sensitivity (msec) | Resolution (μm) | Pattern shape | Layer thickness uniformity (Å) | Pattern defects (the number) |
|---|---|---|---|---|---|
| Example 4 | 160 | 0.48 | Rectangular | 10 | 11 |
| Example 5 | 250 | 0.46 | Rectangular | 13 | 8 |
| Example 6 | 210 | 0.46 | Rectangular | 8 | 10 |
| Example 7 | 200 | 0.46 | Rectangular | 15 | 15 |
| Example 8 | 290 | 0.40 | Rectangular | 9 | 12 |
| Example 9 | 240 | 0.42 | Rectangular | 8 | 10 |
| Comparative Example 1 | 200 | 0.48 | Trapezoidal | 14 | 42 |
| Comparative Example 2 | 200 | 0.50 | Trapezoidal | 20 | 31 |
| Comparative Example 3 | 330 | 0.46 | Scooped at bottom | 16 | 29 |

What is claimed is:

1. A radiation-sensitive resin composition comprising (1) an alkali-soluble resin, (2) a quinonediazide compound and (3) a mixed solvent comprising a monoketone having 7 to 14 carbon atoms and an alkoxypropionic acid alkyl ester.

2. The composition of claim 1, wherein said alkali-soluble resin is a member selected from the group consisting of a novolak resin, polyhydroxystyrene, a styrene-hydroxystyrene copolymer, and a styrene-maleic anhydride copolymer.

3. The composition of claim 2, wherein said alkali-soluble resin is a novolak resin.

4. The composition of claim 3, wherein said novolak resin has a weight-average molecular weight in terms of polystyrene of from 2,000 to 20,000, preferably from 3,000 to 15,000.

5. The composition of claim 1, wherein said quinonediazide compound is an ester compound selected from the group consisting of 1,2-benzoquinonediazido-4-sulfonic acid esters, 1,2-naphthoquinonediazido-4-sulfonic acid esters, 1,2-naphthoquinonediazido-5-sulfonic acid esters and 1,2-naphthoquinonediazido-6-sulfonic acid esters of a polyhydroxyl compound.

6. The composition of claim 5, wherein said quinonediazide compound is an ester compound selected from the group consisting of 1,2-naphthoquinonediazido-4-sulfonic acid esters and 1,2-naphthoquinonediazido-5-sulfonic acid esters of a polyhydroxyl compound.

7. The composition of claim 5, wherein said ester compound has an average esterification percentage of from 20% to 100%, preferably from 40% to 95%.

8. The composition of claim 5, wherein said polyhydroxyl compound is a compound selected from the group consisting of the compounds below:

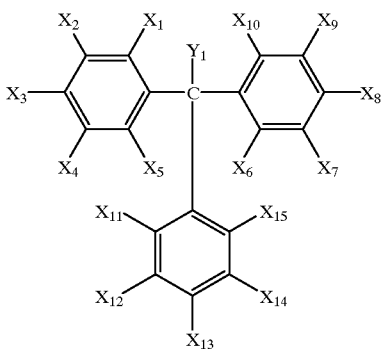

wherein $X_1$ to $X_{25}$ are the same or different and each represent a hydrogen atom, an alkyl group having 1 to 4 carbon atoms, an alkoxyl group having 1 to 4 carbon atoms, an aryl group having 6 to 10 carbon atoms or a hydroxyl group, provided that at least one member in each of the groups $X_1$ to $X_5$ and $X_6$ to $X_{10}$ is a hydroxyl group; and $Y_1$ represents a hydrogen atom or an alkyl group having 1 to 4 carbon atoms;

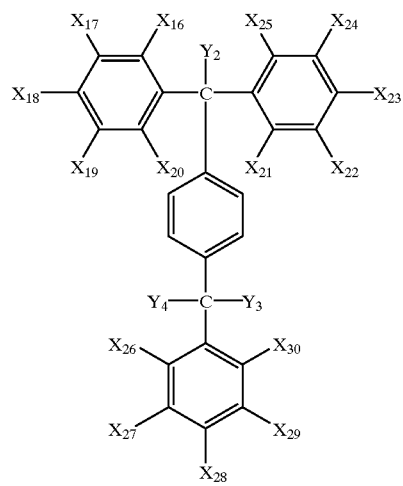

wherein $X_{16}$ to $X_{30}$ are as defined for the above $X_1$ to $X_{15}$, provided that at least one member in each of the groups $X_{16}$ to $X_{20}$, $X_{21}$ to $X_{25}$ and $X_{26}$ to $X_{30}$ is a hydroxyl group; and $Y_2$ to $Y_4$ are the same or different and each represent a hydrogen atom or an alkyl group having 1 to 4 carbon atoms;

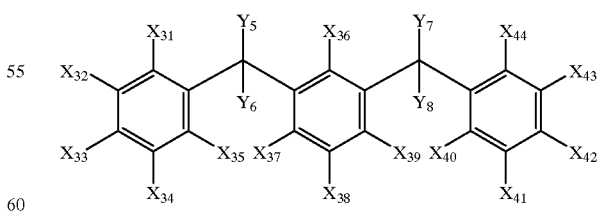

wherein $X_{31}$ to $X_{44}$ are as defined for the above $X_1$ to $X_{15}$, provided that at least one member in the group $X_{31}$ to $X_{35}$ is a hydroxyl group; and $Y_5$ to $Y_8$ are the same or different and each represent a hydrogen atom or an alkyl group having 1 to 4 carbon atoms;

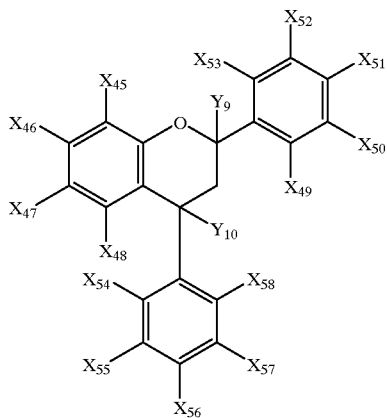

wherein $X_{45}$ to $X_{58}$ may be the same or different and each represent a hydrogen atom, a halogen atom, an alkyl group having 1 to 4 carbon atoms, an alkoxyl group having 1 to 4 carbon atoms, a cycloalkyl group having 5 to 7 carbon atoms or a hydroxyl group, provided that at least one member in each of the groups $X_{45}$ to $X_{48}$ and $X_{49}$ to $X_{53}$ is a hydroxyl group; and $Y_9$ and $Y_{10}$ are the same or different and each represent a hydrogen atom, an alkyl group having 1 to 4 carbon atoms or a cycloalkyl group having 5 to 7 carbon atoms;

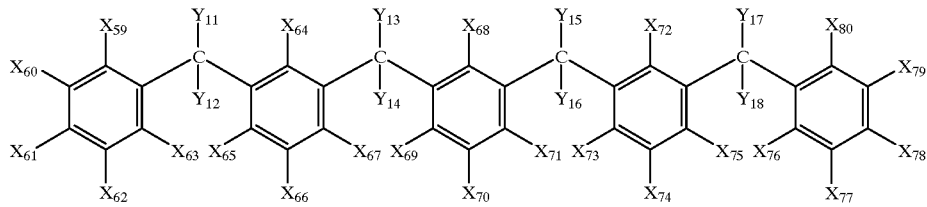

wherein $X_{59}$ to $X_{80}$ are as defined for the above $X_{45}$ to $X_{58}$, provided that at least one member in each of the groups $X_{59}$ to $X_{63}$, $X_{64}$ to $X_{67}$, $X_{72}$ to $X_{75}$ and $X_{76}$ to $X_{80}$ is a hydroxyl group; and $Y_{11}$ to $Y_{18}$ are the same or different and each represent a hydrogen atom or an alkyl group having 1 to 4 carbon atoms; and

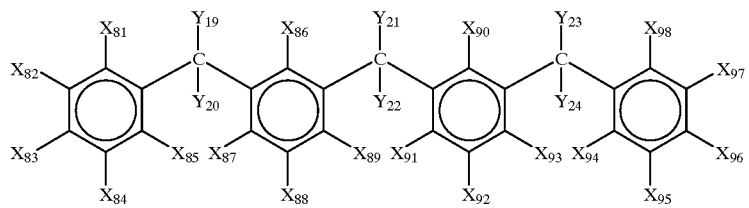

wherein $X_{81}$ to $X_{98}$ are as defined for the above $X_{45}$ to $X_{58}$, provided that at least one member in each of the groups $X_{81}$ to $X_{85}$, $X_{86}$ to $X_{89}$, $X_{90}$ to $X_{93}$ and $X_{94}$ to $X_{98}$ is a hydroxyl group; and $Y_{19}$ to $Y_{24}$ are the same or different and each represent a hydrogen atom or an alkyl group having 1 to 4 carbon atoms.

9. The composition of claim 1, wherein the quinonediazide compound of component (2) is present in an amount of from 5 to 60 parts by weight, preferably from 10 to 50 parts by weight, based on 100 parts by weight of the resin (A) of component (1).

10. The composition of claim 1, wherein the 1,2-quinonediazide sulfonyl residual group is present in an amount of from 5 to 50% by weight, preferably from 10 to 30% by weight, based on the weight of the total solid content of the composition.

11. The composition of claim 1, further comprising a low-molecular-weight phenol compound having 2 to 5 benzene rings.

12. The composition of claim 11, said low-molecular-weight phenol compound is a compound selected from the group consisting of:

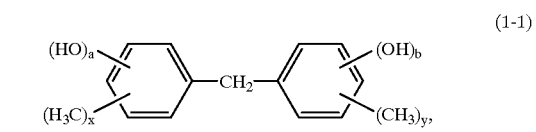

(1-1)

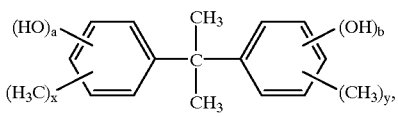
(1-2)

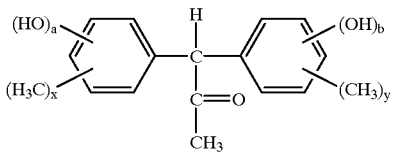
(1-3)

wherein in the formulas (1—1) to (1-3), a and b are each independently an integer of 0 to 3, provided that they are not 0 at the same time; x and y are each independently an integer of 0 to 3; and $a+x \leqq 5$ and $b+y \leqq 5$,

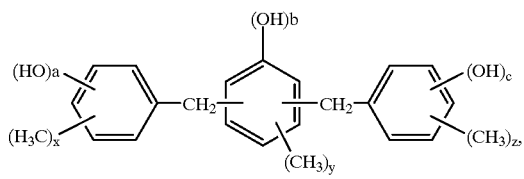
(1-4)

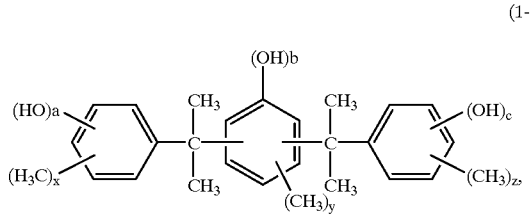
(1-5)

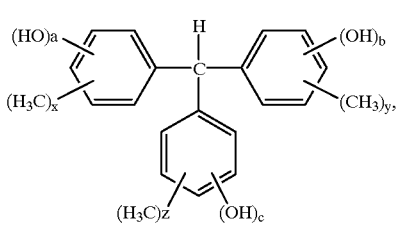
(1-6)

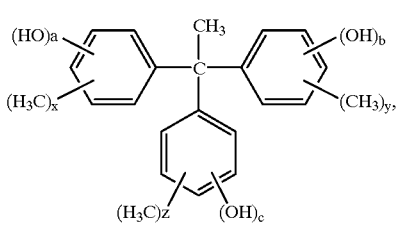
(1-7)

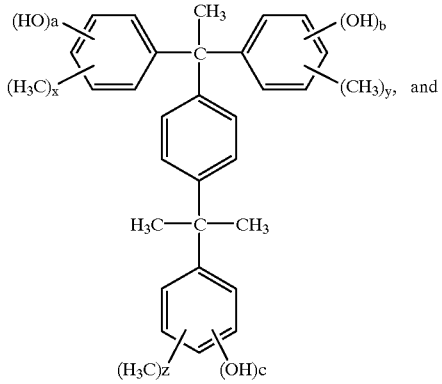
(1-8)

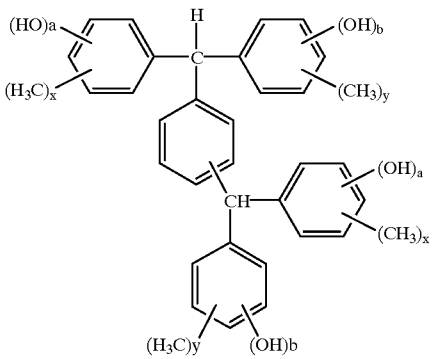
(1-9)

wherein in the formulas (1-4) to (1-9), a, b and c are each independently an integer of 0 to 3, provided that they are not 0 at the same time; x, y and z are each independently an integer of 0 to 3; in the formulas (1-4) and (1-5), $b+y \leqq 4$; and in the formulas (1-6) to (1-9), $a+x \leqq 5$, $b+y \leqq 4$ and $c+z \leqq 5$.

13. The composition of claim 11, wherein said low molecular weight phenol compound is present in an amount of not more than 50 parts by weight, preferably from 5 to 30 parts by weight, based on 100 parts by weight of the resin (A) of component-(1).

14. The composition of claim 1, wherein said monoketone is selected from the group consisting of aliphatic monoketones and alicyclic monoketones.

15. The composition of claim 14, wherein said monoketone is selected from the group consisting of 2-heptanone, 3-heptanone, 4-hepotanone, methyl-n-hexyl ketone, methyl-n, octyl ketone, methyl-n-dodecyl ketone, ethyl-n-pentyl ketone, di-n-propyl ketone, diisopropyl ketone, n-propyl isopropyl ketone, di-n-butyl ketone, di-n-pentyl ketone, 2-methylcyclohexanone, 3-methylcyclohexanone, 4-methylcyclohexanone, 2-ethylcyclohexanone, 4-ethylcyclohexanone, 2-t-butylcyclohexanone, cycloheptanone, cyclooctanone, cyclononanone and cycloundecanone.

16. The composition of claim 1, wherein said alkoxypropionic acid alkyl ester is selected from the group consisting of methyl 3-methoxypropionate, ethyl 3-methoxypropionate, methyl 3-ethoxyproplonate, ethyl 3-ethoxypropionate, n-propyl 3-methoxypropionate and n-butyl 3-methoxypropionate.

17. The composition of claim 1, wherein the monoketone and alkoxypropionic acid alkyl ester are present in a ratio of 10/90 to 90/10, preferably 20/80 to 85/15, by weight.

18. The composition of claim 1, wherein the mixed solvent of component (3) is present such that the entire solid content in the composition is from 10 to 50% by weight.

19. A process of preparing a resist pattern, comprising the steps of coating a composition as claimed in claim 1 on a substrate to form a coating film, drying the coating film to form a resist film, exposing the resist film selectively to a radiation, and developing the exposed resist film to form a resist pattern.

20. The process of claim 19, wherein said radiation is an ultraviolet radiation such as g-rays and i-rays, a far-ultraviolet radiation such as KrF excimer laser beam, an X-radiation such as synchrotron rays and charged-particle radiations such as electron rays.

* * * * *